(12) United States Patent
Itoh et al.

(10) Patent No.: US 7,652,606 B2
(45) Date of Patent: Jan. 26, 2010

(54) D/A CONVERTER

(75) Inventors: Shogo Itoh, Kasugai (JP); Hisao Suzuki, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/048,309

(22) Filed: Mar. 14, 2008

(65) Prior Publication Data
US 2008/0224909 A1   Sep. 18, 2008

(30) Foreign Application Priority Data
Mar. 16, 2007   (JP) ............................. 2007-068753

(51) Int. Cl.
*H03M 1/66* (2006.01)
(52) U.S. Cl. ...................... 341/144; 341/154
(58) Field of Classification Search ................ 341/144, 341/154
See application file for complete search history.

(56) References Cited
U.S. PATENT DOCUMENTS
5,831,566 A * 11/1998 Ginetti ...................... 341/144

6,621,440 B2 * 9/2003 Gorman ...................... 341/154
7,277,036 B2 * 10/2007 Otake ......................... 341/154
7,283,079 B2 * 10/2007 Jain ........................... 341/154

FOREIGN PATENT DOCUMENTS
JP          4-506289 A     10/1992
WO      WO 90/16114 A1    12/1990

* cited by examiner

*Primary Examiner*—Khai M Nguyen
(74) *Attorney, Agent, or Firm*—Arent Fox LLP

(57) ABSTRACT

A digital-analog converter including a first selection circuit of switch elements, which are coupled to each other and to a high potential power supply, and a second selection circuit of switch elements, which are coupled to each other and to a low potential power supply. First and second voltage dividing circuit each include series-connected resistor elements, each coupled between adjacent switch elements of the corresponding selection circuit. A control circuit provides a control signal to the selection circuits to activate one of the switch elements in each selection circuit and couple the activated switch element to the corresponding potential power supply. The first and second voltage dividing circuits divide voltages of the high and low potential power supplies with the resistor elements between the activated switch elements.

10 Claims, 16 Drawing Sheets

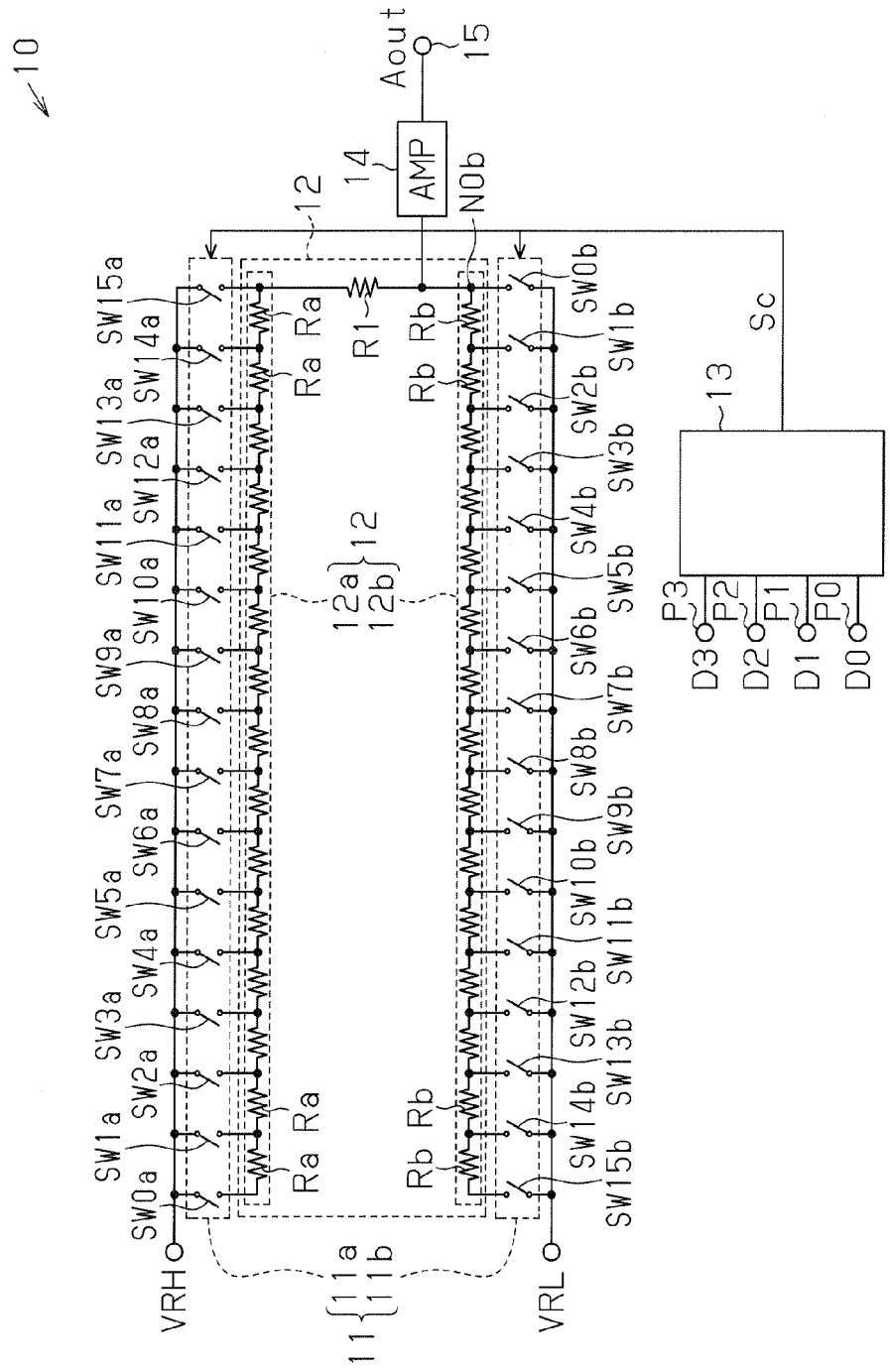

Fig.5

| Code (DEC) | Digital Input Terminal Setting | | | |
|---|---|---|---|---|
| | D3 | D2 | D1 | D0 |
| 15 | H | H | H | H |
| 14 | H | H | H | L |
| 13 | H | H | L | H |
| 12 | H | H | L | L |
| 11 | H | L | H | H |
| 10 | H | L | H | L |
| 9 | H | L | L | H |
| 8 | H | L | L | L |
| 7 | L | H | H | H |
| 6 | L | H | H | L |
| 5 | L | H | L | H |
| 4 | L | H | L | L |
| 3 | L | L | H | H |
| 2 | L | L | H | L |
| 1 | L | L | L | H |
| 0 | L | L | L | L |

Fig.6(a)

| Code (DEC) | High Potential Side Switches |||||||||||||||| 
|---|---|---|---|---|---|---|---|---|---|---|---|---|---|---|---|---|
| | 0a | 1a | 2a | 3a | 4a | 5a | 6a | 7a | 8a | 9a | 10a | 11a | 12a | 13a | 14a | 15a |
| 15 | OFF | OFF | OFF | OFF | OFF | OFF | OFF | OFF | OFF | OFF | OFF | OFF | OFF | OFF | OFF | ON |
| 14 | OFF | OFF | OFF | OFF | OFF | OFF | OFF | OFF | OFF | OFF | OFF | OFF | OFF | OFF | ON | OFF |
| 13 | OFF | OFF | OFF | OFF | OFF | OFF | OFF | OFF | OFF | OFF | OFF | OFF | OFF | ON | OFF | OFF |
| 12 | OFF | OFF | OFF | OFF | OFF | OFF | OFF | OFF | OFF | OFF | OFF | OFF | ON | OFF | OFF | OFF |
| 11 | OFF | OFF | OFF | OFF | OFF | OFF | OFF | OFF | OFF | OFF | OFF | ON | OFF | OFF | OFF | OFF |
| 10 | OFF | OFF | OFF | OFF | OFF | OFF | OFF | OFF | OFF | OFF | ON | OFF | OFF | OFF | OFF | OFF |
| 9 | OFF | OFF | OFF | OFF | OFF | OFF | OFF | OFF | OFF | ON | OFF | OFF | OFF | OFF | OFF | OFF |
| 8 | OFF | OFF | OFF | OFF | OFF | OFF | OFF | OFF | ON | OFF | OFF | OFF | OFF | OFF | OFF | OFF |
| 7 | OFF | OFF | OFF | OFF | OFF | OFF | OFF | ON | OFF | OFF | OFF | OFF | OFF | OFF | OFF | OFF |
| 6 | OFF | OFF | OFF | OFF | OFF | OFF | ON | OFF | OFF | OFF | OFF | OFF | OFF | OFF | OFF | OFF |
| 5 | OFF | OFF | OFF | OFF | OFF | ON | OFF | OFF | OFF | OFF | OFF | OFF | OFF | OFF | OFF | OFF |
| 4 | OFF | OFF | OFF | OFF | ON | OFF | OFF | OFF | OFF | OFF | OFF | OFF | OFF | OFF | OFF | OFF |
| 3 | OFF | OFF | OFF | ON | OFF | OFF | OFF | OFF | OFF | OFF | OFF | OFF | OFF | OFF | OFF | OFF |
| 2 | OFF | OFF | ON | OFF | OFF | OFF | OFF | OFF | OFF | OFF | OFF | OFF | OFF | OFF | OFF | OFF |
| 1 | OFF | ON | OFF | OFF | OFF | OFF | OFF | OFF | OFF | OFF | OFF | OFF | OFF | OFF | OFF | OFF |
| 0 | ON | OFF | OFF | OFF | OFF | OFF | OFF | OFF | OFF | OFF | OFF | OFF | OFF | OFF | OFF | OFF |

Fig.6(b)

| Code (DEC) | Low Potential Side Switches |||||||||||||||| 
|---|---|---|---|---|---|---|---|---|---|---|---|---|---|---|---|---|
| | 15b | 14b | 13b | 12b | 11b | 10b | 9b | 8b | 7b | 6b | 5b | 4b | 3b | 2b | 1b | 0b |
| 15 | ON | OFF | OFF | OFF | OFF | OFF | OFF | OFF | OFF | OFF | OFF | OFF | OFF | OFF | OFF | OFF |
| 14 | OFF | ON | OFF | OFF | OFF | OFF | OFF | OFF | OFF | OFF | OFF | OFF | OFF | OFF | OFF | OFF |
| 13 | OFF | OFF | ON | OFF | OFF | OFF | OFF | OFF | OFF | OFF | OFF | OFF | OFF | OFF | OFF | OFF |
| 12 | OFF | OFF | OFF | ON | OFF | OFF | OFF | OFF | OFF | OFF | OFF | OFF | OFF | OFF | OFF | OFF |
| 11 | OFF | OFF | OFF | OFF | ON | OFF | OFF | OFF | OFF | OFF | OFF | OFF | OFF | OFF | OFF | OFF |
| 10 | OFF | OFF | OFF | OFF | OFF | ON | OFF | OFF | OFF | OFF | OFF | OFF | OFF | OFF | OFF | OFF |
| 9 | OFF | OFF | OFF | OFF | OFF | OFF | ON | OFF | OFF | OFF | OFF | OFF | OFF | OFF | OFF | OFF |
| 8 | OFF | OFF | OFF | OFF | OFF | OFF | OFF | ON | OFF | OFF | OFF | OFF | OFF | OFF | OFF | OFF |
| 7 | OFF | OFF | OFF | OFF | OFF | OFF | OFF | OFF | ON | OFF | OFF | OFF | OFF | OFF | OFF | OFF |
| 6 | OFF | OFF | OFF | OFF | OFF | OFF | OFF | OFF | OFF | ON | OFF | OFF | OFF | OFF | OFF | OFF |
| 5 | OFF | OFF | OFF | OFF | OFF | OFF | OFF | OFF | OFF | OFF | ON | OFF | OFF | OFF | OFF | OFF |
| 4 | OFF | OFF | OFF | OFF | OFF | OFF | OFF | OFF | OFF | OFF | OFF | ON | OFF | OFF | OFF | OFF |
| 3 | OFF | OFF | OFF | OFF | OFF | OFF | OFF | OFF | OFF | OFF | OFF | OFF | ON | OFF | OFF | OFF |
| 2 | OFF | OFF | OFF | OFF | OFF | OFF | OFF | OFF | OFF | OFF | OFF | OFF | OFF | ON | OFF | OFF |
| 1 | OFF | OFF | OFF | OFF | OFF | OFF | OFF | OFF | OFF | OFF | OFF | OFF | OFF | OFF | ON | OFF |
| 0 | OFF | OFF | OFF | OFF | OFF | OFF | OFF | OFF | OFF | OFF | OFF | OFF | OFF | OFF | OFF | ON |

Fig.7

| Code (DEC) | Output Voltage | Unit |
|---|---|---|
| 15 | 0.938 | |
| 14 | 0.875 | |
| 13 | 0.813 | |
| 12 | 0.750 | |
| 11 | 0.688 | |
| 10 | 0.625 | |
| 9 | 0.563 | |
| 8 | 0.500 | V |
| 7 | 0.438 | |
| 6 | 0.375 | |
| 5 | 0.313 | |
| 4 | 0.250 | |
| 3 | 0.188 | |
| 2 | 0.125 | |
| 1 | 0.063 | |
| 0 | 0.000 | |

(VRH=1.000V, VRL=0.000V)

Fig.14

| Code (DEC) | Intermediate Potential Switches | | | | | | | | | | | | | | | |
|---|---|---|---|---|---|---|---|---|---|---|---|---|---|---|---|---|
| | 15c | 14c | 13c | 12c | 11c | 10c | 9c | 8c | 7c | 6c | 5c | 4c | 3c | 2c | 1c | 0c |
| 15 | OFF | OFF | OFF | OFF | OFF | OFF | OFF | OFF | ON | OFF | OFF | OFF | OFF | OFF | OFF | OFF |
| 14 | OFF | OFF | OFF | OFF | OFF | OFF | OFF | OFF | OFF | ON | OFF | OFF | OFF | OFF | OFF | OFF |
| 13 | OFF | OFF | OFF | OFF | OFF | OFF | OFF | OFF | OFF | OFF | ON | OFF | OFF | OFF | OFF | OFF |
| 12 | OFF | OFF | OFF | OFF | OFF | OFF | OFF | OFF | OFF | OFF | OFF | ON | OFF | OFF | OFF | OFF |
| 11 | OFF | OFF | OFF | OFF | OFF | OFF | OFF | OFF | OFF | OFF | OFF | OFF | ON | OFF | OFF | OFF |
| 10 | OFF | OFF | OFF | OFF | OFF | OFF | OFF | OFF | OFF | OFF | OFF | OFF | OFF | ON | OFF | OFF |
| 9 | OFF | OFF | OFF | OFF | OFF | OFF | OFF | OFF | OFF | OFF | OFF | OFF | OFF | OFF | ON | OFF |
| 8 | OFF | OFF | OFF | OFF | OFF | OFF | OFF | OFF | OFF | OFF | OFF | OFF | OFF | OFF | OFF | ON |
| 7 | ON | OFF | OFF | OFF | OFF | OFF | OFF | OFF | OFF | OFF | OFF | OFF | OFF | OFF | OFF | OFF |
| 6 | OFF | ON | OFF | OFF | OFF | OFF | OFF | OFF | OFF | OFF | OFF | OFF | OFF | OFF | OFF | OFF |
| 5 | OFF | OFF | ON | OFF | OFF | OFF | OFF | OFF | OFF | OFF | OFF | OFF | OFF | OFF | OFF | OFF |
| 4 | OFF | OFF | OFF | ON | OFF | OFF | OFF | OFF | OFF | OFF | OFF | OFF | OFF | OFF | OFF | OFF |
| 3 | OFF | OFF | OFF | OFF | ON | OFF | OFF | OFF | OFF | OFF | OFF | OFF | OFF | OFF | OFF | OFF |
| 2 | OFF | OFF | OFF | OFF | OFF | ON | OFF | OFF | OFF | OFF | OFF | OFF | OFF | OFF | OFF | OFF |
| 1 | OFF | OFF | OFF | OFF | OFF | OFF | ON | OFF | OFF | OFF | OFF | OFF | OFF | OFF | OFF | OFF |
| 0 | OFF | OFF | OFF | OFF | OFF | OFF | OFF | ON | OFF | OFF | OFF | OFF | OFF | OFF | OFF | OFF |

Fig.16

| Code (DEC) | Output Voltage | | Unit |
|---|---|---|---|
| | AOUT | XAOUT | |
| 15 | 0.938 | 0.063 | V |
| 14 | 0.875 | 0.125 | |
| 13 | 0.813 | 0.188 | |
| 12 | 0.750 | 0.250 | |
| 11 | 0.688 | 0.313 | |
| 10 | 0.625 | 0.375 | |
| 9 | 0.563 | 0.438 | |
| 8 | 0.500 | 0.500 | |
| 7 | 0.438 | 0.563 | |
| 6 | 0.375 | 0.625 | |
| 5 | 0.313 | 0.688 | |
| 4 | 0.250 | 0.750 | |
| 3 | 0.188 | 0.813 | |
| 2 | 0.125 | 0.875 | |
| 1 | 0.063 | 0.938 | |
| 0 | 0.000 | 1.000 | |

(VRH=1.000V, VRL=0.000V)

D/A CONVERTER

CROSS-REFERENCE TO RELATED APPLICATIONS

This application is based upon and claims the benefit of priority from the prior Japanese Patent Application No. 2007-068753, filed on Mar. 16, 2007, the entire contents of which are incorporated herein by reference.

BACKGROUND

1. Field

The present disclosure relates to a digital-analog (D/A) converter, and more particularly, to a D/A converter including resistor elements for dividing voltages of a high potential power supply and a low potential power supply.

The development in digital technology has advanced digitalization of electrical appliances, such as audio equipment and video equipment. It is desirous that such an electrical appliance incorporate a D/A converter having higher operation speeds.

2. Description of the Related Art

FIG. 1 shows a conventional D/A converter 40 including voltage dividing resistor elements. The D/A converter 40 includes a voltage generation circuit 41, which is configured by sixteen resistor elements R, and a voltage selection circuit 42, which is configured by switch elements SW0 to SW15. The sixteen resistor elements R are set to have the same resistance value. Further, the sixteen resistor elements R are connected in series between a high potential power supply VRH and a low potential power supply VRL. The voltage generation circuit 41 equally divides the difference between the voltage of the high potential power supply VRH and the voltage of the low potential power supply VRL with the sixteen resistor elements R to generate divided voltages. Voltages V0 to V15 obtained by equally dividing the voltage difference between the high potential power supply VRH and the low potential power supply VRL are generated at nodes N0 to N15. The nodes N0 to N15 are defined by connection points of adjacent resistor elements R, a connection point between the low potential power supply VRL and its closest resistor element R, and a connection point between the high potential power supply VRH and the closest resistor R. The terminals of the resistor elements R that are closer to the low potential power supply VRL side, that is, the nodes N0 to N15, are respectively coupled to first terminals of the switch elements SW0 to SW15. The switch elements SW0 to SW15 have second terminals that are coupled to one another. The second terminals of the switch elements SW0 to SW15 are each coupled to an output terminal 44. The voltage selection circuit 42 is controlled by a control circuit 43. The control circuit 43 receives from an external device four bits of digital signals D0 to D3 representing a setting code. Then, the control circuit 43 decodes the digital signals D0 to D3, generates a control signal, and provides the control signal to the voltage selection circuit 42 to activate one of the switch elements SW0 to SW15.

The activated switch element couples one of the nodes N0 to N15 of the voltage generation circuit 41 to the output terminal 44. Therefore, voltage at a node N16 of the voltage selection circuit 42 is varied in accordance with the voltage at one of the nodes N0 to N15 coupled to the activated switch. In this manner, the D/A converter 40 outputs an analog signal AOUT having a voltage corresponding to the setting code (digital signals D0 to D3).

Japanese Laid-Open Patent Publication No. 4-506289 describes another example of a conventional D/A converter that includes ladder resistors and switches coupled to the output terminal side of the resistors.

SUMMARY

One aspect of the present disclosure is a digital-analog converter having a first selection circuit including a plurality of first switch elements, with each first switch element having a first terminal and a second terminal. The first terminals of the plurality of first switch elements are coupled to each other and to a high potential power supply. A second selection circuit includes a plurality of second switch elements, with each second switch element having a first terminal and a second terminal. The first terminals of the plurality of second switch elements are coupled to each other and to a low potential power supply. A first voltage dividing circuit includes a plurality of resistor elements connected in series, with each resistor element being coupled between the second terminals of two adjacent ones of the plurality of first switch elements. A second voltage dividing circuit includes a plurality of resistor elements connected in series. The second voltage dividing circuit is coupled to the first voltage dividing circuit at a coupling node. Each resistor element of the second voltage dividing circuit is coupled between the second terminals of two adjacent ones of the plurality second switch elements. A control circuit generates a control signal based on a digital signal and provides the control signal to the first selection circuit and the second selection circuit. The first selection circuit selectively activates one of the plurality of first switch elements in response to the control signal and couples a first selected node coupled to the second terminal of the activated first switch element to the high potential power supply. The second selection circuit selectively activates one of the plurality of second switch elements in response to the control signal and couples a second selected node coupled to the second terminal of the activated second switch element to the low potential power supply. The first voltage dividing circuit and the second voltage dividing circuit divide voltages of the high potential power supply and the low potential power supply with the resistor elements of the first voltage dividing circuit and the second voltage dividing circuit between the first selected node and the second selected node. The digital-analog converter outputs an analog signal having the divided voltage from the coupling node.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of embodiments together with the accompanying drawings in which:

FIG. 4 is a block circuit diagram of a D/A converter according to a first embodiment;

FIG. 5 is a table showing the relationship between setting codes and digital signals;

FIGS. 6(a) and 6(b) are tables showing the ON/OFF setting of switch elements in association with the setting codes;

FIG. 7 is a table showing the relationship between the setting codes and voltages at an output terminal;

FIG. 14 is a table showing the relationship between the setting codes and switch settings;

FIG. 16 is a table showing the relationship between the setting codes and output terminal voltages of the D/A converter shown in FIG. 15.

DETAILED DESCRIPTION OF EMBODIMENTS

Figure 2:
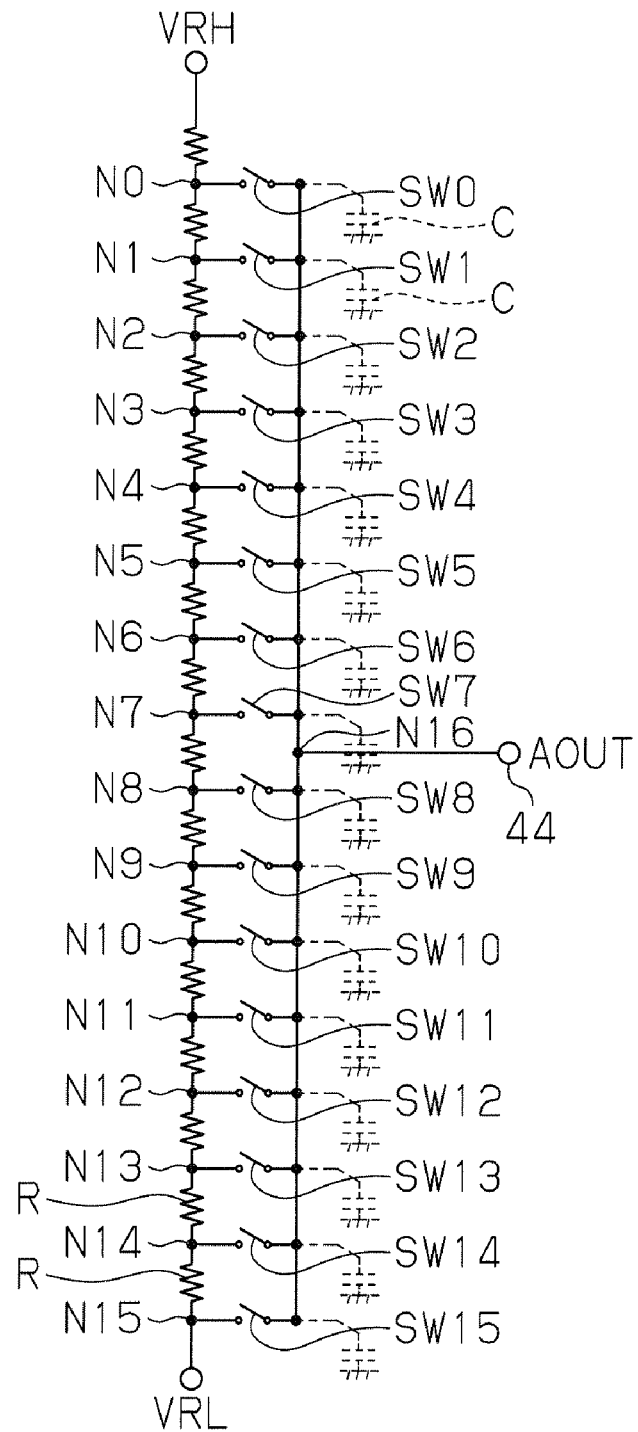
FIGS. 2, 3(a), and 3(b) are schematic diagrams showing the operation of the conventional D/A converter.
Figure 3A:
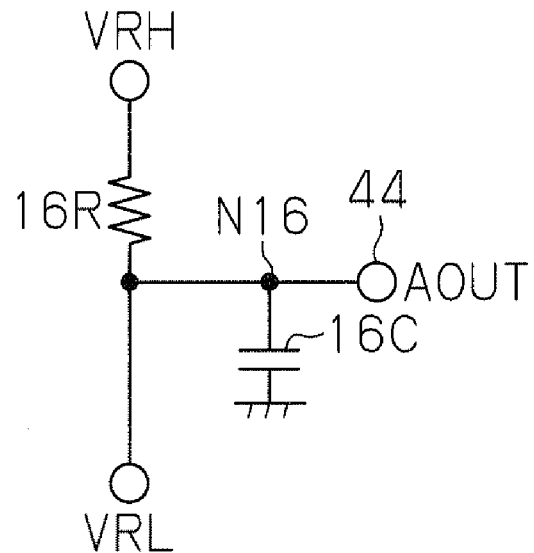
Figure 3B:
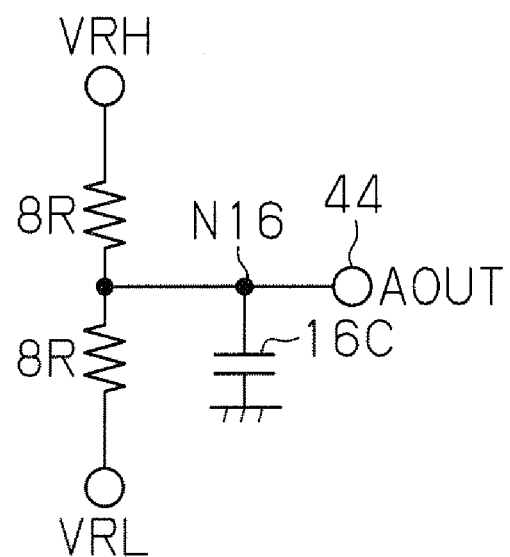

Parasitic capacitors are formed throughout the D/A converter 40. As shown in FIG. 2, a parasitic capacitor C formed at the second terminal of each of the switch elements SW0 to SW15 affects the output characteristics of the D/A converter 40. For example, when the switch element that is activated by the digital signals D0 to D3 is switched to another switch element, the divided voltage selected by the activated switch element is applied to the parasitic capacitor C. This varies the voltage between the terminals of the parasitic capacitor C and charges or discharges the parasitic capacitor C. Accordingly, the time required to charge or discharge the parasitic capacitor C increases as the difference in the voltages of the analog signal AOUT before and after the switching of the switch elements increases. More specifically, the charging or discharging time of the parasitic capacitor C increases as the difference between the terminal voltage of the parasitic capacitor C prior to switching of the switch element and the divided voltage selected by the switch element subsequent to switching increases. This lengthens the output response time of the D/A converter, that is, the time required for the voltage of the analog signal AOUT to stabilize after the switching of switches. The parasitic capacitors formed at the second terminals of the switch elements SW0 to SW15, which are coupled to one another, are coupled in parallel to the output terminal of the D/A converter 40. Referring to FIG. 3(a), this connection is equivalent to a state in which a parasitic capacitor that has a total capacitance value (16C) of sixteen parasitic capacitors C is coupled to the output terminal. When shifting from a state in which the parasitic capacitor is charged with the voltage of the low potential power supply VRL to a state in which an intermediate voltage between the voltage of the high potential power supply VRH and the voltage of the low potential power supply VRL is output as shown in FIG. 3(b), the time required to charge the parasitic capacitor C significantly increases due to a high time constant CR of the circuit.

A digital-analog (D/A) converter 10 according to a first embodiment of the present invention will now be discussed with reference to FIGS. 4 to 11.

As shown in FIG. 4, the D/A converter 10 receives digital signals D0 to D3 for a plurality of bits (four bits in the first embodiment) representing a setting code. Then, the D/A converter 10 generates and outputs an analog signal AOUT corresponding to the setting code. The D/A converter 10 generates the analog signal AOUT having, for example, an intermediate voltage between the voltage of a high potential power supply VRH and the voltage of a low potential power supply VRL in accordance with the digital signals D0 to D3.

The high potential power supply VRH is coupled to a first switch circuit 11a of a selection circuit 11. The low potential power supply VRL is coupled to a second switch circuit 11b of the selection circuit 11. The first switch circuit 11a, which serves as a first selection circuit, includes a plurality of switch elements SW0a to SW15a. The number of the switch elements SW0a to SW15a is determined in correspondence with the number of bits of the setting code (four bits) and is thus sixteen ($2^n$, n is number of bits) The switch elements SW0a to SW15a each have a first terminal and a second terminal. The first terminals of the switch elements SW0a to SW15a are coupled to one another and to the high potential power supply VRH. The second terminals of the switch elements SW0a to SW15a are coupled to a voltage generation circuit 12. The second switch circuit 11b, which serves as a second selection circuit, includes a plurality of switch elements SW0b to SW15b. The number of the switch elements SW0b to SW15b is determined in correspondence with the number of bits of the setting code (four bits) and is thus sixteen ($2^n$, n is the number of bits). The switch elements SW0b to SW15b each have a first terminal and a second terminal. The first terminals of the switch elements SW0b to SW15b are coupled to one another and to the low potential power supply VRL. The second terminals of the switch elements SW0b to SW15b are coupled to the voltage generation circuit 12.

The voltage generation circuit 12 includes a first voltage dividing circuit 12a, which is coupled to the first switch circuit 11a, and a second voltage dividing circuit 12b, which is coupled to the second switch circuit 11b. The first voltage dividing circuit 12a includes a plurality of resistor elements Ra. The resistor elements Ra are respectively coupled between the second terminals of adjacent switch elements SW0a to SW15a, which configure the first switch circuit 11a. The resistor elements Ra are connected in series. The number of the resistor elements Ra is one less than the number of the switch elements SW0a to SW15a ($2^n-1$). When a selected one of the switch elements SW0a to SW15a is activated, the resistor elements Ra are coupled to the high potential power supply VRH via the activated switch element.

The second voltage dividing circuit 12b includes a plurality of resistor elements Rb, which are respectively coupled between the second terminals of adjacent switch elements SW0b to SW15b, which configure the second switch circuit 11b. In the second voltage dividing circuit 12b, the number of the resistor elements Rb, which are connected in series, is one less than the number of the switch elements SW0b to SW15b ($2^n-1$). When the selected one of the switch elements SW0b to SW15b is activated, the resistor elements Rb are coupled to the low potential power supply VRL via the activated switch element.

A resistor element R1 is coupled between the first voltage dividing circuit 12a and the second voltage dividing circuit 12b. The plurality of resistor elements Ra in the first voltage dividing circuit 12a, the resistor element R1, and the resistor elements Rb in the second voltage dividing circuit 12b are connected in series. The resistor elements R1, Ra, and Rb each have the same resistance value. The resistor element R1 prevents short-circuiting between the high potential power supply VRH and the low potential power supply VRL.

An output node N0b (coupling node) between the resistor element R1 and the second voltage dividing circuit 12b is coupled to an input terminal of an amplifier 14. An output terminal of the amplifier 14 is coupled to an output terminal 15 of the D/A converter 10. The amplifier 14 is an operational amplifier, which includes an output terminal and a non-inverting input terminal that are coupled to each other and has a gain set to one. Such an operational amplifier outputs an analog signal AOUT having a voltage equal to the voltage at the output node N0b between the resistor element R1 and the second voltage dividing circuit 12b.

A control circuit 13 receives the digital signals D0 to D3. The control circuit 13 decodes the digital signals D0 to D3 and generates a control signal Sc corresponding to the digital signals D0 to D3. The control signal Sc is generated to selectively activate one of the switch elements SW0a to SW15a in the first switch circuit 11a and one of the switch elements SW0b to SW15b in the second switch circuit 11b.

As shown in FIGS. 6(a) and 6(b), the switch elements that are activated are in correspondence with a setting code represented by the digital signals D0 to D3. In FIG. 6(a), characters 0a to 15a respectively correspond to the switch elements SW0a to SW15a. In FIG. 6(b), characters 0b to 15b and 6(b) respectively correspond to the switch elements SW0b to SW15b.

The setting code will now be described with reference to FIG. 5. Each of the digital signals D0 to D3 input to the control circuit 13 is a binary (BIN) digital signal of having a high (H) level or a low (L) level. The level of each digital signal D0 to D3 is determined in accordance with a decimal (DEC) setting code. The control circuit 13 decodes the input digital signals D0 to D3 and generates the control signal Sc to activate the switch elements SW0a to SW15a and SW0b to SW15b in correspondence with the setting code.

If the digital signals D0 to D3 each have an H level, the setting code is "15" (see FIG. 5). In this case, the switch element SW15a and the switch element SW15b are selectively activated (see FIGS. 6(a) and 6(b)). Sixteen resistor elements (one resistor element R1 and fifteen resistor elements Rb) are connected in series between the activated switch elements SW15a and SW15b. Further, the activated switch element SW15a couples the resistor element R1 to the high potential power supply VRH, and the activated switch element SW15b couples the resistor element Rb that is closest to the low potential power supply VRL to the low potential power supply VRL. Therefore, sixteen resistor elements, which are connected in series, couple the high potential power supply VRH and the low potential power supply VRL, and fifteen resistor elements Rb couple the output node N0b and the low potential power supply VRL. The voltages of the high potential power supply VRH and the low potential power supply VRL are divided by the resistor elements. The resistor elements Ra, Rb, and R1 have the same resistance value. In the above example, a divided voltage (15/16(VRH−VRL)+VRL) corresponding to the number of resistor elements Rb between the output node N0b and the low potential power supply VRL is generated at the output node N0b.

In another example, if the digital signals D0 to D3 each have an L level, the setting code is "0". In this case, the switch element SW0a and the switch element SW0b are selectively activated. Sixteen resistor elements (fifteen resistor elements Ra and one resistor element R1) are connected in series between the activated switch elements SW0a and SW0b. The activated switch element SW0a couples the resistor element Ra that is closest to the high potential power supply VRH to the high potential power supply VRH, and the activated switch element SW0b couples the resistor element R1 to the low potential power supply VRL. In this example, sixteen resistor elements, which are connected in series, couple the high potential power supply VRH and the low potential power supply VRL, but there is no resistor element Rb that couples the output node N0b and the low potential power supply VRL. The voltages of the high potential power supply VRH and the low potential power supply VRL are divided by the resistor elements. In this example, the divided voltage (0/16(VRH−VRL)+VRL) corresponding to the number of resistor elements Rb between the output node N0b and the low potential power supply VRL is generated at the output node N0b.

In this manner, in the first embodiment, sixteen resistor elements, the number of which corresponds to the number of types of the setting code, are connected in series between the high potential power supply VRH and the low potential power supply VRL. Further, the setting code determines the number of resistor elements connected in series between the output node N0b and the low potential power supply VRL. FIG. 7 shows the relationship between the setting code and the output voltage (voltage at output node N0b) when the high potential power supply VRH is 1V and the low potential power supply VRL is 0V.

Figure 8:
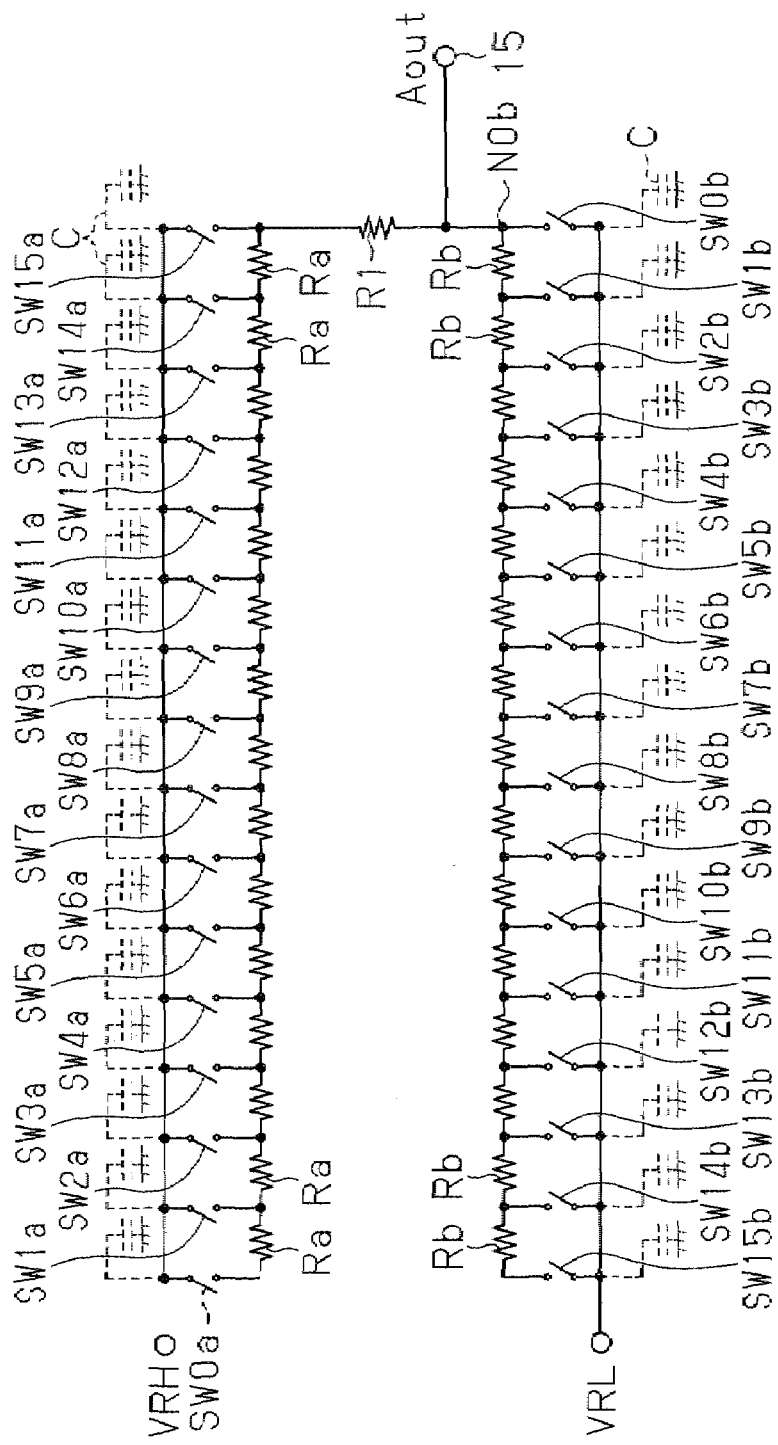
FIGS. 8, 9(a), and 9(b) are schematic diagrams showing the operation of the D/A converter shown in FIG. 4.
Figure 9A:
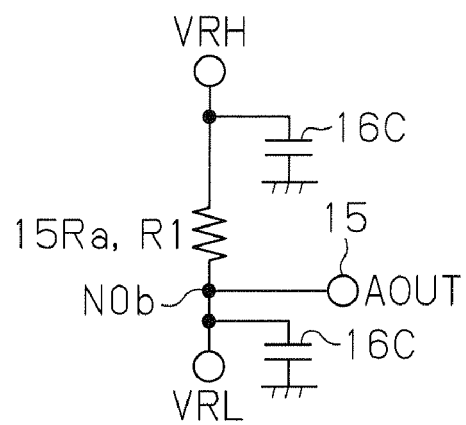
Figure 9B:
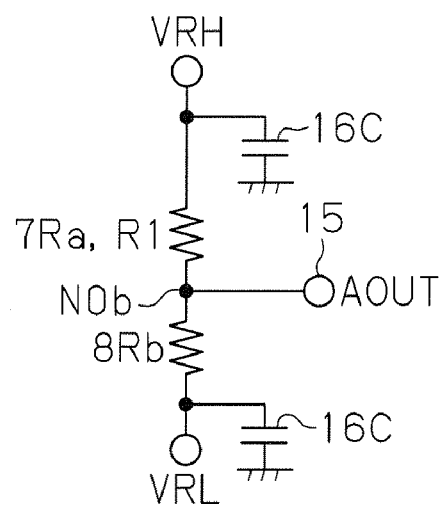
Figure 10A:
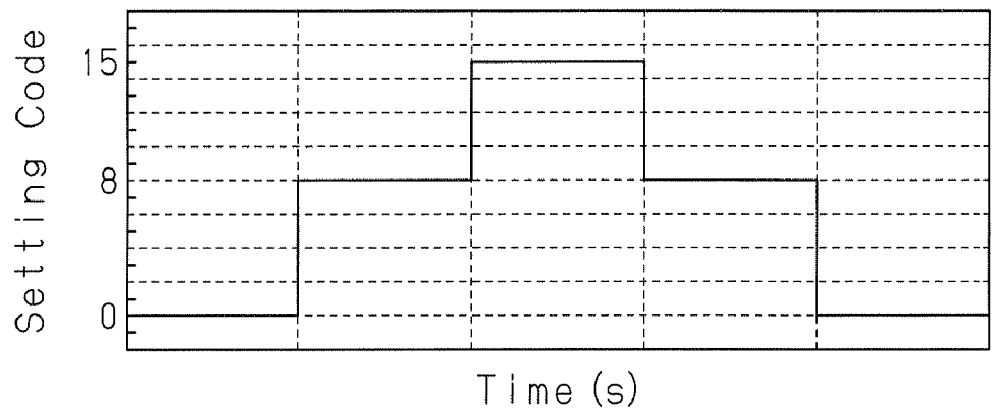
FIGS. 10(a), 10(b), 11(a), and 11(b) are waveform charts showing the operation of the D/A converter of FIG. 4 and the conventional D/A converter.
Figure 10B:
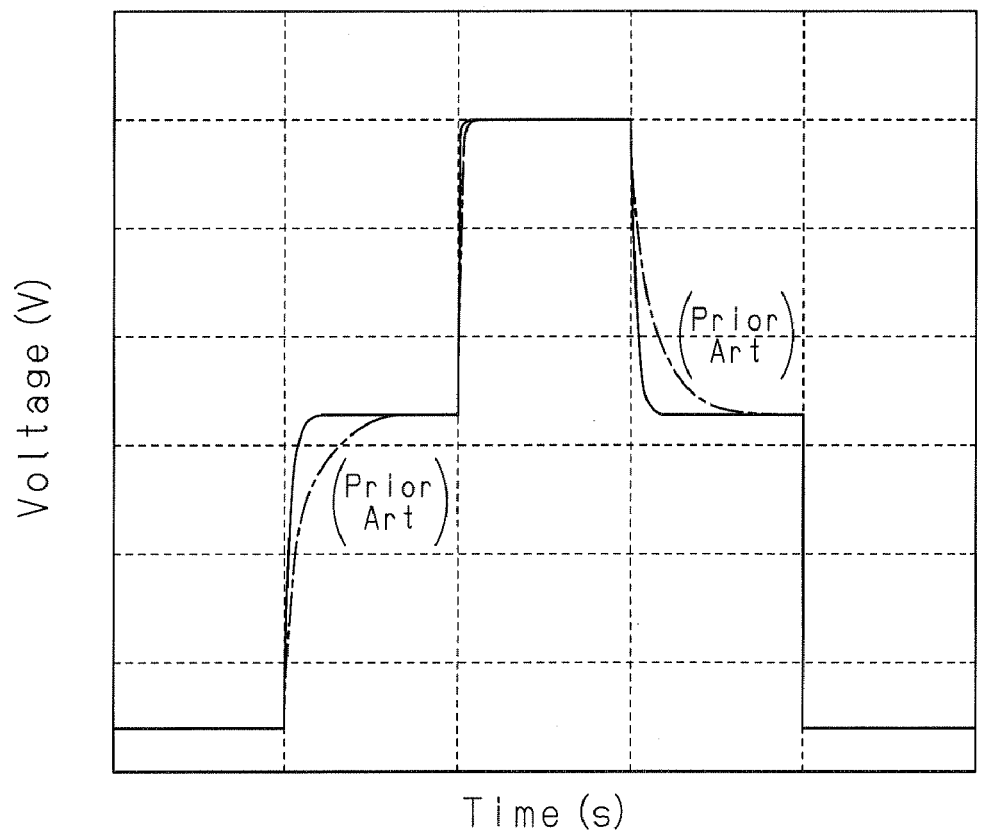
Figure 11:
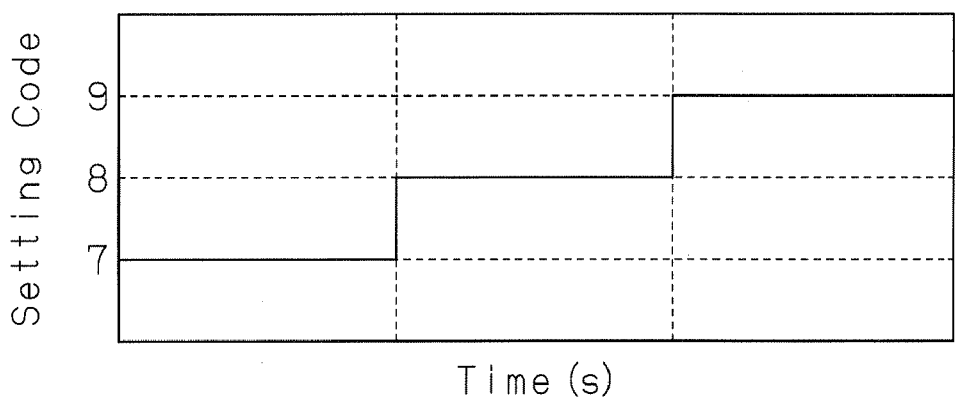
Figure 11:
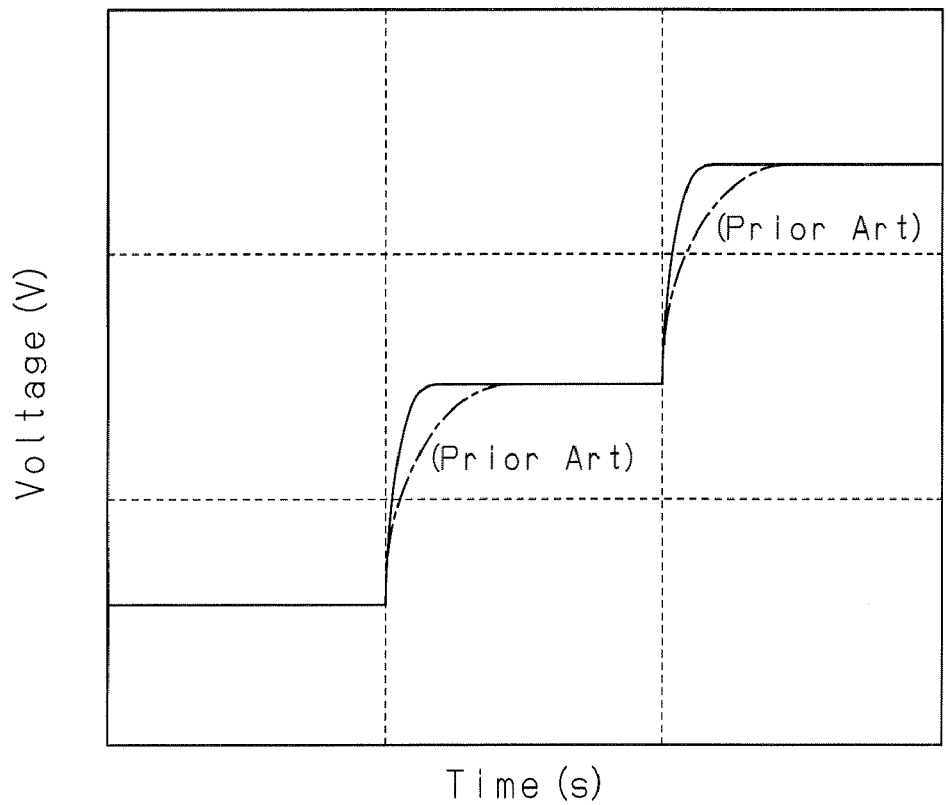

As shown in FIG. 8, a parasitic capacitor C is generated at each switch element of the first switch circuit 11a and the second switch circuit 11b. Each parasitic capacitor C is directly coupled to the high potential power supply VRH or the low potential power supply VRL and indirectly coupled to the output terminal 15 via the resistor elements Ra, Rb, and R1. That is, the parasitic capacitor C of each of the switch elements SW0a to SW15a in the first switch circuit 11a is coupled between the high potential power supply VRH and ground, and the parasitic capacitor C of each of the switch elements SW0b to SW15b in the second switch circuit 11b is coupled between the low potential power supply VRL and ground. Such parasitic capacitors C are not coupled to the output terminal 15. Thus, as shown in FIGS. 9(a) and 9(b), the voltage between the terminals of synthesized parasitic capacitors 16C does not vary even if there is a change in the coupling state of the resistor element between the high potential power supply VRH and output node N0b and the coupling state of the resistor element between the output node N0b and low potential power supply VRL in accordance with the setting code. Thus, the parasitic capacitors C are neither charged nor discharged. Changes in the voltage at the output node N0b are not affected by the parasitic capacitors C. This shortens the time required for the analog signal AOUT to stabilize after the digital signals D0 to D3 are changed. That is, the output response time is shortened.

The operation of the D/A converter 10 will now be described.

As described above, the parasitic capacitor C in each switch element of the first switch circuit 11a and the second switch circuit 11b is directly coupled to the high potential power supply VRH or low potential power supply VRL and indirectly coupled to the output terminal 15 via the resistor elements Ra, Rb, and R1. Thus, the terminal voltage of the parasitic capacitor C for each switch element does not change and the parasitic capacitor C is neither charged nor discharged even when shifting from a state shown in FIG. 9(a) corresponding to the setting code "0" in which the parasitic capacitors C are not charged to a state shown in FIG. 9(a) corresponding to the setting code "8". Accordingly, the output terminal 15 outputs the analog signal AOUT with the desired voltage in correspondence with the setting code without having to wait for the parasitic capacitor C to be charged.

Figure 1:
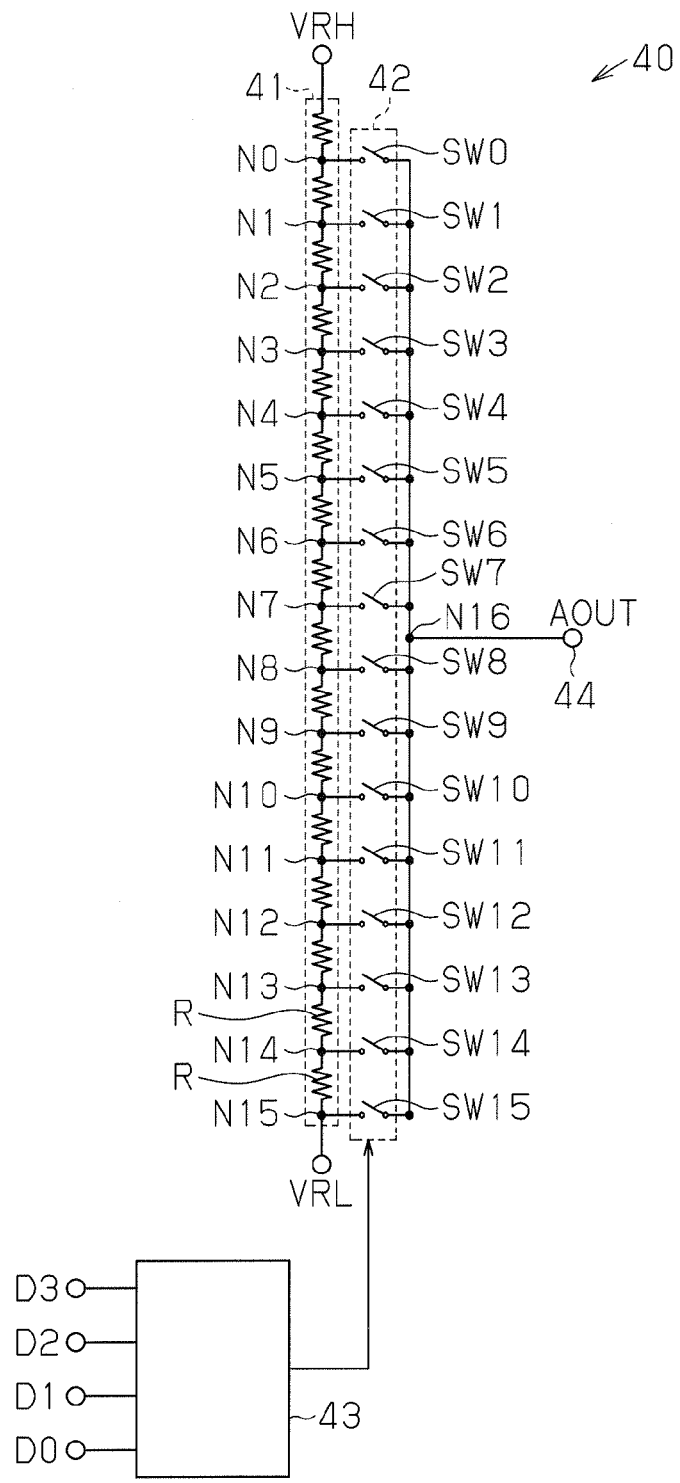
FIG. 1 is a block circuit diagram of a conventional D/A converter.

In the conventional D/A converter 40 shown in FIG. 1, after the setting code is changed, the parasitic capacitor C of each of the switch elements SW0 to SW15 must be charged or discharged before the analog signal AOUT of the desired voltage is output. For example, when changing the setting code in a manner of "0"→"8"→"15"→"8"→"0" at timings shown in FIG. 10(a), the voltage of the analog signal AOUT in the conventional art varies as shown by the broken line in FIG. 10(b). When the setting code is changed as "0"→"8" and "15"→"8", the time constant CR of the circuit becomes maximum, and the time required for the voltage of the analog signal AOUT to reach the desired voltage becomes longer. In comparison, in the D/A converter 10 of the first embodiment, the parasitic capacitor C of each of the switch elements SW0a to SW15a, SW0b to SW15b is neither charged nor discharged from when the setting code is switched to when the analog signal AOUT of the desired voltage is output. Therefore, as shown by the solid line in FIG. 10(b), the analog signal AOUT having the desired voltage is readily output and the output response time becomes shorter than that in the conventional art even when the voltage of the analog signal AOUT is varied by changing the setting code in the manner of "0"→"8" and "15"→"8".

Further, when the setting code is changed between values in front of and behind "8", that is, when the setting code is changed in the manner of "7"→"8"→"9" as shown in FIG. 11(a), the time for outputting the analog signal AOUT with the desired voltage becomes long in the conventional D/A converter, as shown with by the broken line in FIG. 11(b). In comparison, in the D/A converter 10 of the first embodiment, the analog signal AOUT having the desired voltage is readily output, and the output response time is shortened, as shown by the solid line in FIG. 11(b).

The first embodiment has the advantage described below.

(1) The first terminals of the switch elements SW0a to SW15a in the first switch circuit 11a are coupled to one another and to the high potential power supply VRH. The first terminals of the switch elements SW0b to SW15b in the second switch circuit 11b are coupled to one another and to the low potential power supply VRL. The resistor elements Ra of the first voltage dividing circuit 12a are coupled between the second terminals of the switch elements SW0a to SW15a, and the resistor elements Rb of the second voltage dividing circuit 12b are coupled between the second terminals of the switch elements SW0b to SW15b. The control circuit 13 activates one of the switch elements SW0a to SW15a in the first switch circuit 11a and one of the switch elements SW0b to SW15b in the second switch circuit 11b based on the digital signals D0 to D3. As a result, the activated switch element in the first switch circuit 11a couples a first selected node, which is coupled to the second terminal of the activated switch element, to the high potential power supply VRH. Further, the activated switch element in the second switch circuit 11b couples a second selected node, which is coupled to the second terminal of the activated switch element, to the low potential power supply VRL. The analog signal AOUT of a potential voltage dividing the voltages of the high potential power supply VRH and the low potential power supply VRL by the resistor elements between the first selected node and the second selected node is output from the output node N0b, which is a connection point between the first voltage dividing circuit 12a and the second voltage dividing circuit 12b.

Accordingly, the parasitic capacitor in each of the switch elements SW0a to SW15a and SW0b to SW15b is directly coupled to the high potential power supply VRH or the low potential power supply VRL. Thus, the terminal voltage of the parasitic capacitor does not vary, and the parasitic capacitor is neither charged nor discharged even when the control circuit 13 switches the activated switch element. This outputs the analog signal AOUT with the desired voltage without having to wait to charge or discharge the parasitic capacitor. Accordingly, the output response time is shortened compared to a D/A converter in which the parasitic capacitor is directly coupled to the output terminal and the analog signal is output with the desired voltage after completing the charging or discharging of the parasitic capacitor.

A D/A converter 20 according to a second embodiment of the present invention will now be described with reference to FIG. 12. To avoid redundancy, like or same reference numerals are given to those components that are the same as the corresponding components of the first embodiment. Such components will not be described below.

Figure 12:
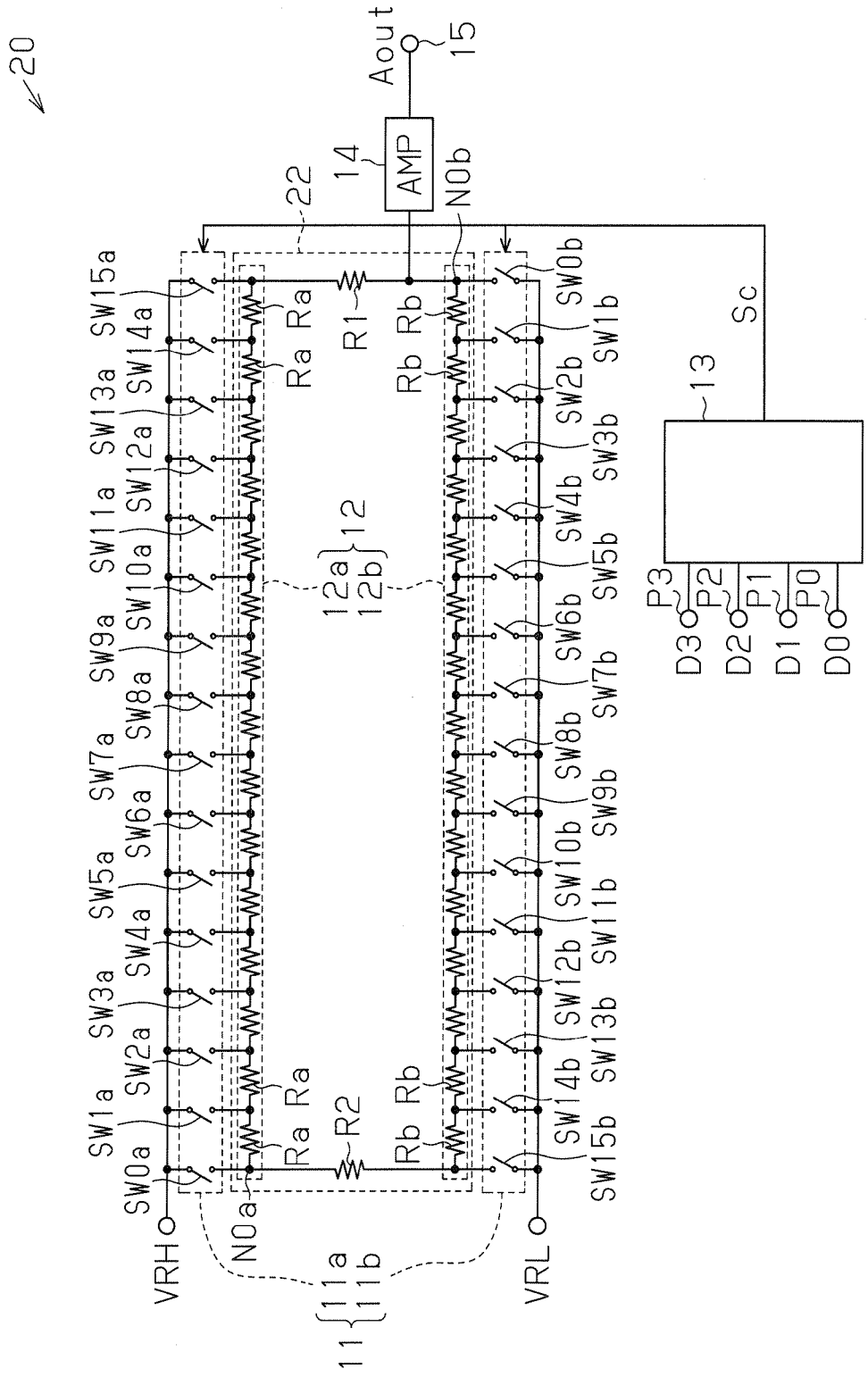
FIG. 12 is a block circuit diagram of a D/A converter according to a second embodiment.

Referring to FIG. 12, the D/A converter 20 of the second embodiment adds to the structure of the D/A converter 10 in the first embodiment a resistor element R2 coupled between the switch element SW0a of the first switch circuit 11a and the switch element SW15b of the second switch circuit 11b. The resistor R2 prevents noise from being mixed in the first voltage dividing circuit 12a and the second voltage dividing circuit 12b, which form a voltage generation circuit 22. The resistor element R2 and the resistor element R1 have the same resistance value.

More specifically, in the first embodiment, when the switch element SW0a at the left end as viewed in FIG. 4 is deactivated, the node between the switch element SW0a and the one of the resistor elements Ra farthest from the resistor element R1 is not coupled to any device and becomes a so-called open terminal. Therefore, the voltage at this node may fluctuate, depending on the environment, when affected by external noise. This may fluctuate the voltage at the node to which the activated switch element is coupled. That is, voltage fluctuations may occur in the high potential power supply VRH. In the same manner, when the switch element SW15b at the left end as viewed in FIG. 4 is deactivated, the node between the switch element SW15b and the one of the resistor elements Rb farthest from the resistor element R1 becomes an open terminal. Thus, voltage fluctuations may occur in the low potential power supply VRL.

In the second embodiment, the resistor elements R1 and R2 respectively couple the two ends of the first voltage dividing circuit 12a including a plurality of resistor elements Ra, which are connected in series, to the two ends of the second voltage dividing circuit 12b including a plurality of resistor elements Rb, which are connected in series. Accordingly, the resistor elements Ra, Rb, R1, and R2 are coupled so as to form a ring. The total number of resistor elements becomes even due to the addition of the resistor element R2. Further, a circuit with sixteen resistor elements, which are connected in series, is coupled between the high potential power supply VRH and the low potential power supply VRL. To this circuit, another circuit including the remaining series-connected resistor elements, the number of which is the same as the resistor elements of the above circuit, is coupled in parallel. Therefore, current flows from the high potential power supply VRH towards the low potential power supply VRL in two current paths, a first current path extending through the resistor element R1 and a second current path extending through the resistor element R2. Thus, the voltage of each resistor element and the nodes between the resistor elements is less likely to be influenced by noise. This improves noise resistance.

In addition to the advantage of the first embodiment, the second embodiment has the advantage described below.

(2) The resistor element R2 couples the resistor element Ra of the first voltage dividing circuit 12a and the resistor element Rb of the second voltage dividing circuit 12b so as to form a ring. This eliminates open terminals from the voltage generation circuit 22, reduces the influence of mixed noise, and suppresses fluctuation of the analog signal AOUT.

A D/A converter 30 according to a third embodiment of the present invention will now be discussed with reference to FIG. 13. To avoid redundancy, like or same reference numerals are given to those components that are the same as the corresponding components shown in FIGS. 4 to 12. Such components will not be described below.

Figure 13:
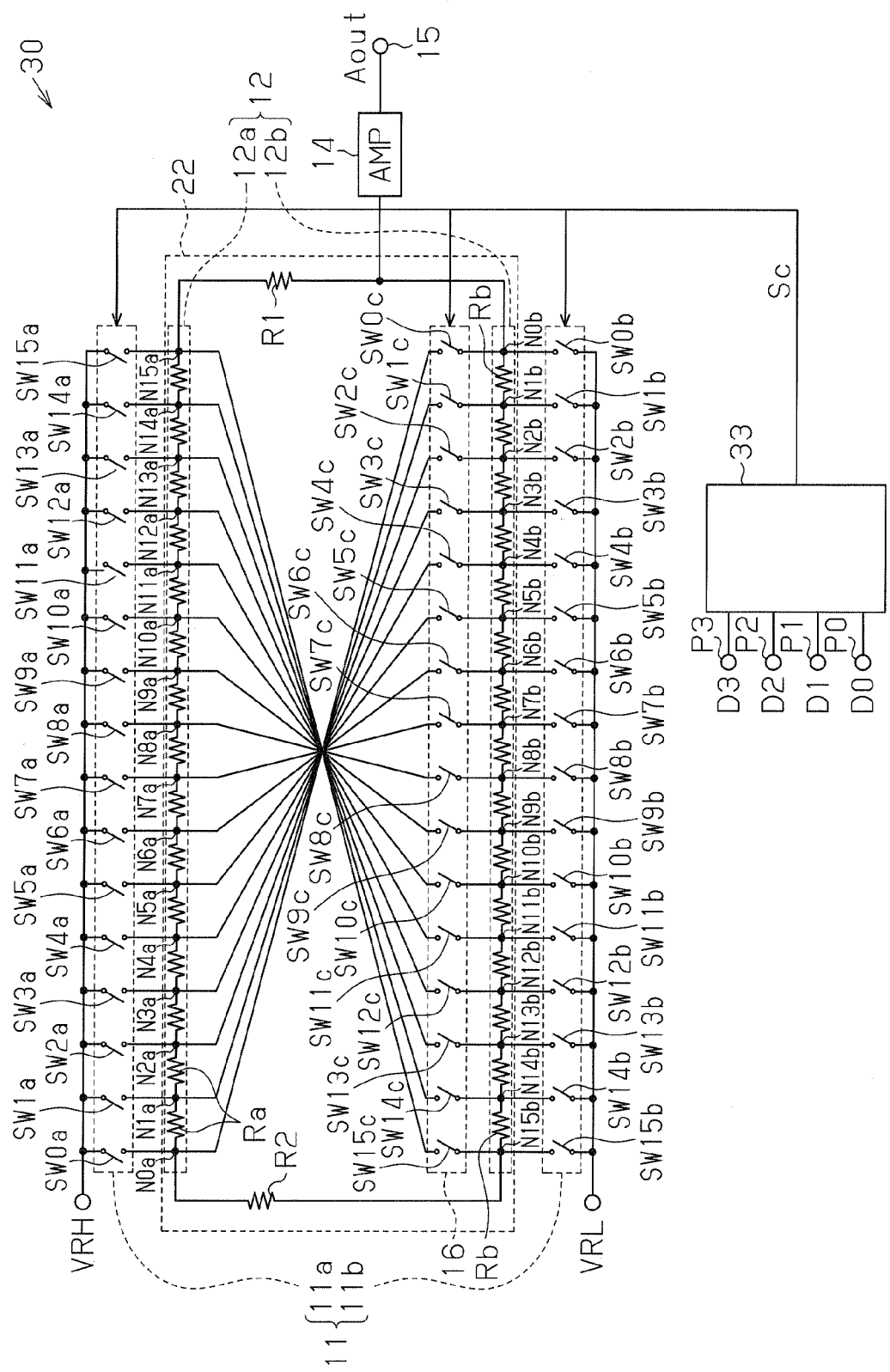
FIG. 13 is a block circuit diagram of a D/A converter according to a third embodiment.

As shown in FIG. 13, the D/A converter 30 of the third embodiment is formed by adding a third switch circuit 16, which serves as a third selection circuit, to the D/A converter 20 of the second embodiment. In the same manner as the first switch circuit 11a and the second switch circuit 11b, the third switch circuit 16 includes sixteen switch elements SW0c to SW15c. The switch elements SW0c to SW15c are coupled between two nodes coupled to the second terminals of the two simultaneously activated switch elements in the first switch circuit 11a and the second switch circuit 11b. In one example shown in FIGS. 6(a) and 6(b), the two switch elements that are simultaneously activated are the switch element SW0a of the first switch circuit 11a and the switch element SW0b of the second switch circuit 11b. The switch element SW0c of the third switch circuit 16 is coupled between node N0a, which is coupled to the switch element SW0a, and output node N0b, which is coupled to the switch element SW0b. A control circuit 33 generates a control signal for activating and deactivating the plurality of switch elements SW0c to SW15c in the third switch circuit 16.

In the same manner as in the first embodiment, the control circuit 33 generates the control signal Sc, which controls the activation and deactivation of the switch elements SW0a to SW15a in the first switch circuit 11a and the switch elements SW0b to SW15b in the second switch circuit 11b, based on the digital signals D0 to D3 representing a control code.

Further, the control circuit 33 generates a control signal for controlling the switch elements SW0c to SW15c of the third switch circuit 16 to couple the two nodes between the second terminals of the two simultaneously activated switch elements in the first switch circuit 11a and the second switch circuit 11b. In the third embodiment, the first voltage dividing circuit 12a and the second voltage dividing circuit 12b each includes fifteen resistor elements Ra, Rb. The resistor elements R1 and R2 couple the first voltage dividing circuit 12a and the second voltage dividing circuit 12b so as to form a ring. The resistor elements Ra, Rb, R1, and R2 have the same resistance value. Accordingly, sixteen resistor elements are coupled between the high potential power supply VRH and the low potential power supply VRL. When the setting code is, for example, "8", the switch element SW8a of the first switch circuit 11a and the switch element SW8b of the second switch circuit 11b are activated. Further, as shown in FIG. 14, the control circuit 33 generates and provides the third switch circuit 16 with a control signal for activating the switch element SW0c coupled between intermediate nodes N0a and N0b of node N8a, which is coupled to the switch element SW8a, and node N8b, which is coupled to the switch element SW8b.

The operation of the D/A convertor 30 will now be discussed.

All operations except for those related to the third switch circuit 16 are the same as the first embodiment and second embodiment and thus will not be described.

When the setting code is "0", the switch element SW0a of the first switch circuit 11a and the switch element SW0b of the second switch circuit 11b are both activated. Further, the voltage at output node N0b is VRL and the analog signal AOUT having the voltage of VRL is output. In this state, when provided with the digital signals D0 to D3 representing setting code "8", the control circuit 33 generates a control signal Sc corresponding to the setting code. In response to the control signal Sc, node N8a is coupled to the high potential power supply VRH via the switch element SW8a, and node N8b is coupled to the low potential power supply VRL via the switch element SW8b.

Furthermore, node N0a and output node N0b are coupled to each other via the switch element SW0c. In this case, charges move between the node N0a coupled to the high potential power supply VRH and the output node N0b coupled to the low potential power supply VRL in correspondence with the setting code "0". The voltages at the two nodes N0a and N0b become an intermediate voltage between the voltage of the high potential power supply VRH and voltage of the low potential power supply VRL. This stabilizes the potential at each of nodes N0a to N15a and N0b to N15b in the D/A converter 30 more quickly than a circuit that does not include the third switch circuit 16. As a result, the voltage of the analog signal AOUT also stabilizes quickly.

In addition to the advantages of the second embodiment, the third embodiment has the advantage described below.

(3) One of the switch elements in the third switch circuit 16 is selectively activated in accordance with the setting code, and a current path connecting the one of the nodes N0a to N15a that has the intermediate voltage between the voltage of the high potential power supply VRH and the voltage of the low potential power supply VRL to the one of the output nodes N0b to N15b that has the intermediate voltage is coupled. When the setting code is changed, current flows through one of the switch elements SW0c to SW15c, and charges are transferred between the first current path and the second current path. This readily stabilizes the potential at each of the nodes N0a to N15a and N0b to N15b in the D/A converter 30. Furthermore, the voltage of the analog signal AOUT stabilizes more quickly than a circuit that does include the switch elements SW0c to SW15c.

It should be apparent to those skilled in the art that the present invention may be embodied in many other specific forms without departing from the spirit or scope of the invention. Particularly, it should be understood that the present invention may be embodied in the following forms.

Figure 15:
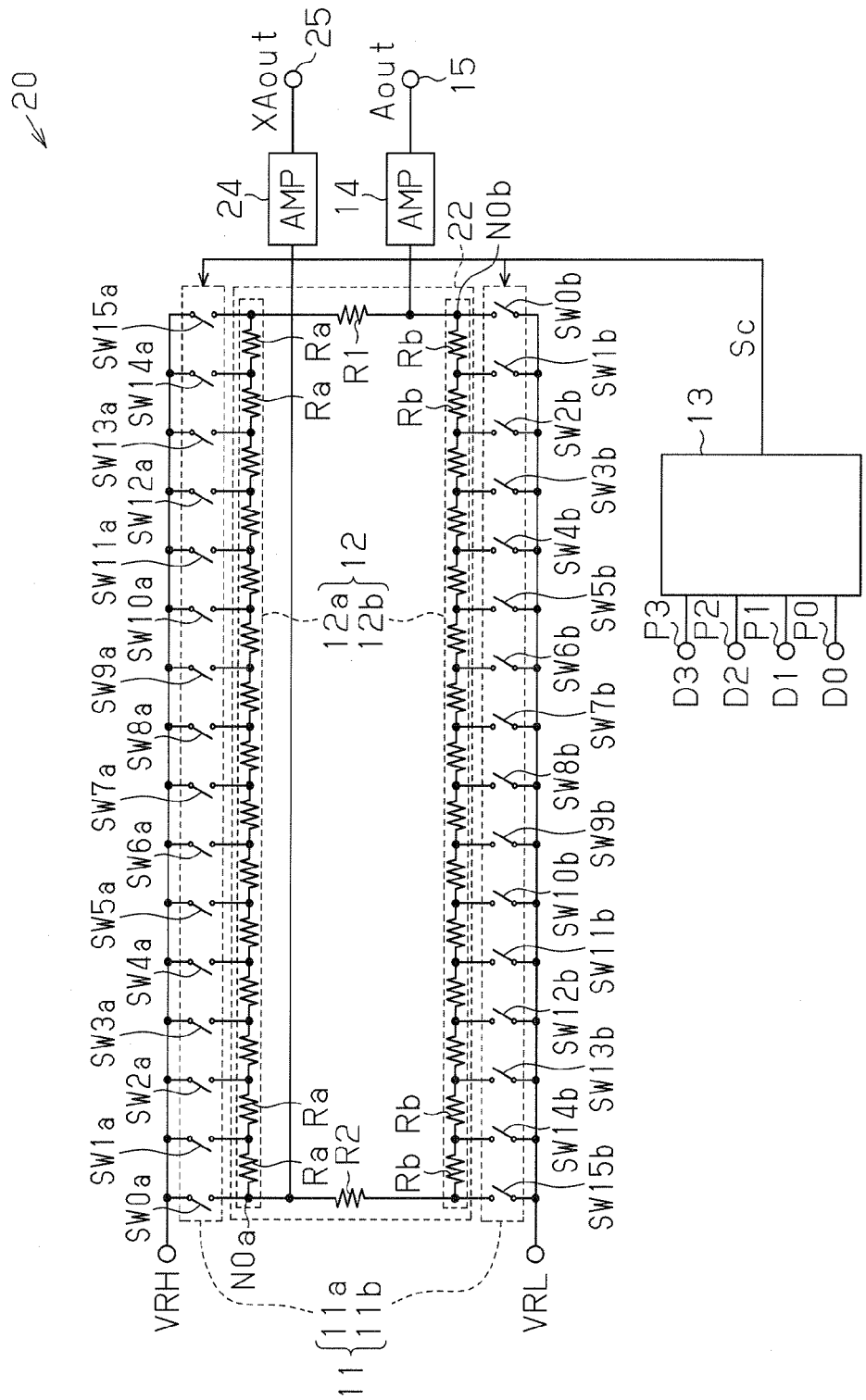
FIG. 15 is a block circuit diagram of a further D/A converter.

In the second embodiment, as shown in FIG. 15, an output terminal 25 may be coupled via an amplifier 24 to the node N0a at which the voltage difference from the high potential power supply VRH (or low potential power supply VRL) becomes equal to the voltage difference between the voltage at the output node N0b and the low potential power supply VRL (or high potential power supply VRH). BY coupling the output terminal 25 to the node N0a in this manner, an analog signal XAOUT that varies inversely to the analog signal AOUT can be output, as shown in FIG. 16. In the same manner, the amplifier 24 may be used in the third embodiment to output the analog signal XAOUT.

In each of the above embodiments, the resistor elements Ra, Rb, and R1 have the same resistance value. This generates an analog signal having a linear characteristic. However, the resistance values of the resistor elements do not have to be the same and may differ from one another. Furthermore, the resistor elements Ra and Rb coupled between the switch elements SW0a to SW15a and SW0b to SW15b may have different resistance values so that the analog signal AOUT is varied in a non-linear manner. This enables the generation of an analog signal having a secondary curve characterization.

The resistor element R1 may be eliminated from each of the above embodiments. Alternatively, the resistor element R1 may be coupled between the amplifier 14 and the second voltage dividing circuit 12b. Also, the resistor element R1 mayo be coupled to between the amplifier 14 and the first voltage dividing circuit 12a and between the amplifier 14 and the second voltage dividing circuit 12b.

In each of the above embodiments, the D/A converter converts the digital signals D0 to D3 for four bits to an analog signal. However, the present invention may also be applied to a D/A converter that converts digital signals of three bits or less or digital signals of five bits or more.

The present examples and embodiments are to be considered as illustrative and not restrictive, and the invention is not to be limited to the details given herein, but may be modified within the scope and equivalence of the appended claims.

What is claimed is:

1. A digital-analog converter comprising:
  a first selection circuit including a plurality of first switch elements, with each first switch element having a first terminal and a second terminal, wherein the first terminals of the plurality of first switch elements are coupled to each other and to a high potential power supply;

a second selection circuit including a plurality of second switch elements, with each second switch element having a first terminal and a second terminal, wherein the first terminals of the plurality of second switch elements are coupled to each other and to a low potential power supply;

a first voltage dividing circuit including a plurality of resistor elements connected in series, with each resistor element being coupled between the second terminals of two adjacent ones of the plurality of first switch elements;

a second voltage dividing circuit including a plurality of resistor elements connected in series, with the second voltage dividing circuit being coupled to the first voltage dividing circuit at a coupling node, and each resistor element of the second voltage dividing circuit being coupled between the second terminals of two adjacent ones of the plurality second switch elements; and a control circuit which provides control signal to the first selection circuit and the second selection circuit;

wherein the first selection circuit selectively activates one of the plurality of first switch elements in response to the control signal and couples a first selected node coupled to the second terminal of the activated first switch element to the high potential power supply;

wherein the second selection circuit selectively activates one of the plurality of second switch elements in response to the control signal and couples a second selected node coupled to the second terminal of the activated second switch element to the low potential power supply;

wherein the first voltage dividing circuit and the second voltage dividing circuit divide voltages of the high potential power supply and the low potential power supply with the resistor elements of the first voltage dividing circuit and the second voltage dividing circuit between the first selected node and the second selected node;

wherein the digital-analog converter outputs an analog signal having the divided voltage from the coupling node; and wherein the digital-analog converter comprises a third selection circuit including a plurality of third switch elements, with any one of the plurality of third switch elements operating based on the control signal to couple the first selected node coupled to the high potential power supply to the second selected node coupled to the low potential power supply.

2. The digital-analog converter according to claim 1, further comprising:
a resistor element coupled between the coupling node and at least one of the first voltage dividing circuit and the second voltage dividing circuit.

3. The digital-analog converter according to claim 1, wherein the control circuit generates the control signal so that the number of the resistor elements between the first selected node and the second selected node is kept constant before and after switching the first and second switch elements.

4. The digital-analog converter according to claim 3, wherein the control circuit generates the control signal so that the number of the resistor elements connected in series between the coupling node and one of the high potential power supply and the low potential power supply are in correspondence with a digital signal.

5. The digital-analog converter according to claim 1, wherein the resistor elements in the first voltage dividing circuit and the resistor elements in the second voltage dividing circuit have the same resistance value.

6. The digital-analog converter according to claim 1, wherein each of the resistor elements in the first voltage dividing circuit have a resistance value that differs from that of each of the resistor elements in the second voltage dividing circuit.

7. The digital-analog converter according to claim 1, further comprising:
resistor elements which couple the plurality of resistor elements in the first voltage dividing circuit and the plurality of resistor elements in the second voltage dividing circuit so as to form a ring.

8. The digital-analog converter according to claim 1, further comprising:
a first resistor element which couples the coupling node to at least one of the first voltage dividing circuit and the second voltage dividing circuit; and
a second resistor element which couples the plurality of resistor elements in the first voltage dividing circuit, the first resistor element, and the plurality of resistor elements in the second voltage dividing circuit so as to form a ring.

9. The digital-analog converter according to claim 8, further comprising:
a first current path extending through the first resistor element between the first selected node and the second selected node;
a second current path extending through the second resistor element between the first selected node and the second selected node, wherein the first current path and the second current path each include an equal even number of resistor elements; and
a plurality of switch element pairs formed by the plurality of first switch elements in the first selection circuit and the plurality of second switch elements in the second selection circuit, with the first switch element and the second switch element of each switch element pair being simultaneously activated in response to the control signal;
wherein the plurality of third switch elements are respectively associated with the plurality of switch element pairs, and each third switch element being coupled between the first switch element and the second switch element of the associated switch element pair, wherein the control provides the third selection circuit with the control signal generated based on a digital signal, and the third selection circuit activates the ones of the plurality of third switch elements coupled to an intermediate node between the first selected node and the second selected node in response to the control signal.

10. The digital-analog converter according to claim 7, further comprising:
an output terminal coupled to a node at which a voltage difference with the high potential power supply is equal to a voltage difference with the low potential power supply, wherein the output terminal outputs a second analog signal having the voltage at the node.

* * * * *